United States Patent [19]

Wada et al.

[11] Patent Number: 5,145,889

[45] Date of Patent: Sep. 8, 1992

[54] ACID ANHYDRIDE-CURED EPOXY RESIN ENCAPSULANT WITH TRIORGANOTHIOPHOSPHITE

[75] Inventors: Yusuke Wada, Tokyo; Michiya Higashi, Kawasaki, both of Japan

[73] Assignee: Kabushiki Kaisha Toshiba, Kawasaki, Japan

[21] Appl. No.: 442,551

[22] Filed: Nov. 28, 1989

[30] Foreign Application Priority Data

Dec. 23, 1988 [JP] Japan ................. 63-323391

[51] Int. Cl.⁵ .................... C08K 5/49; C08K 5/50
[52] U.S. Cl. .................... 523/451; 525/505; 525/508; 525/533
[58] Field of Search ............ 523/451; 525/533, 505, 525/508

[56] References Cited

U.S. PATENT DOCUMENTS

| | | | |
|---|---|---|---|
| 3,868,388 | 2/1975 | Dotson, Jr. et al. | 524/94 |
| 4,492,789 | 1/1985 | Nakashima et al. | 525/533 |
| 4,617,584 | 10/1986 | Ikeya et al. | 525/485 |
| 4,701,481 | 10/1987 | Bogan et al. | 523/428 |
| 4,732,952 | 3/1988 | Hirsekorn et al. | 525/530 |

FOREIGN PATENT DOCUMENTS 59-62624 4/1984 Japan.
60-140884 7/1985 Japan.

*Primary Examiner*—John C. Bleutge
*Assistant Examiner*—Robert E. L. Sellers, II
*Attorney, Agent, or Firm*—Oblon, Spivak, McClelland, Maier & Neustadt

[57] ABSTRACT

A light-emitting diode device includes a light-emitting diode chip, lead-frames respectively connected to an anode and a cathode of the light-emitting diode chip, an encapsulant for encapsulating the light-emitting diode chip and the lead-frames, and a buffer layer, formed between the encapsulant, on the one hand, and the light-emitting diode chip and the lead-frames, on the other, for reducing the stress acting from the encapsulant onto the light-emitting diode chip and the lead-frames. This device can be minimized degradation of quality caused by this stress, and maintained high product quality for a long period of time. An encapsulating epoxy resin composition contains 100 parts by weight of an epoxy resin, 70 to 140 parts by weight of a curing agent including an acid anhydride, 0.5 to 4.0 parts by weight of a curing accelerator including an onium or diazabicycloalkene salt, and 0.1 to 5.0 parts by weight of a thiophosphite. This resin composition can be suitably used as an encapsulant for LED devices.

5 Claims, 3 Drawing Sheets

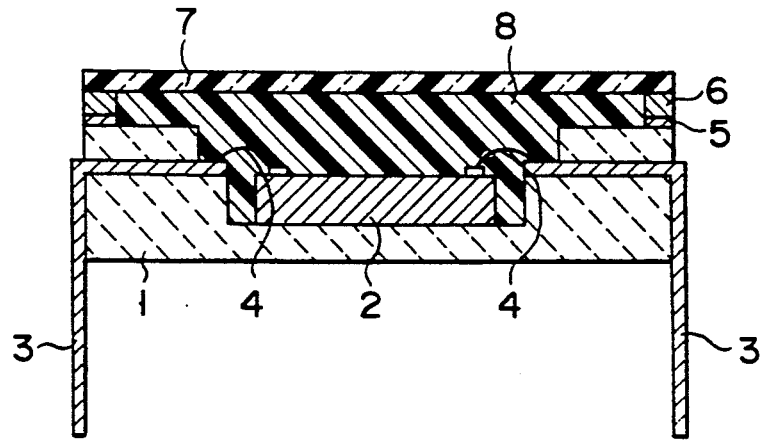
F I G. 5
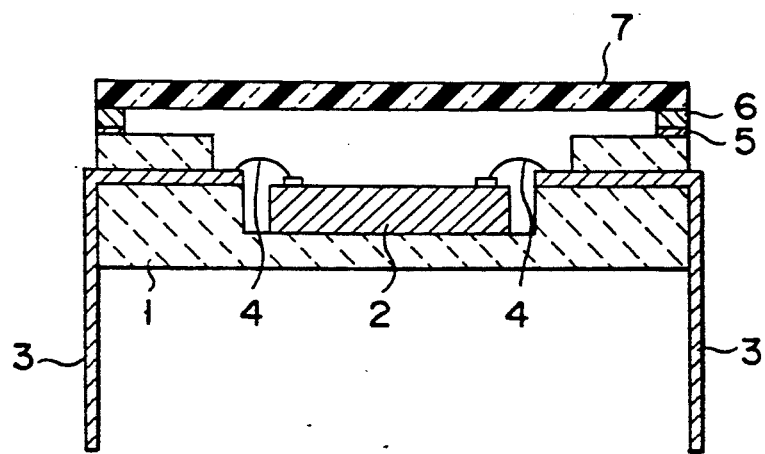
F I G. 6

ACID ANHYDRIDE-CURED EPOXY RESIN ENCAPSULANT WITH TRIORGANOTHIOPHOSPHITE

BACKGROUND OF THE INVENTION

1. Field of the Invention

The present invention relates to a light-emitting diode device having a long service life, and an encapsulant used in this light-emitting diode device.

2. Description of the Related Art

Resin encpsulation of semiconductor devices has been practiced to maintain the quality and facilitate the handling of the devices. Many kinds of resin have been used as transparent encapsulants for light-emitting diodes (to be referred to hereinafter as LEDs), typical example thereof being an epoxy resin composition containing an acid anhydride curing agent and a curing accelerator.

Published Unexamined Japanese Patent Application Nos. 59-62624 and 60-140884 disclose epoxy resin compositions by adding, respectively, thiophosphite compounds and thio-phosphoric acids to improve transparency.

An internal stress occurs in these encapsulants, generating a strain which adversely affects the semiconductor elements encapsulated therein by causing internal disconnections and decreases in luminance. In particular, Infrared Ray (IR) and yellow LEDs tend to be adversely affected by this distortion and stress.

An attempt is made to obtain a low stress encapsulant as a means for solving the above problem.

The following methods are available to decrease the stress of the encapsulant:

(1) A method for decreasing the glass transition temperature (Tg) of a resin. This method includes techniques for making an encapsulant flexible and a technique for decreasing the crosslinking density of a resin.

(2) A method wherein a resin composition is prepared such that the coefficient of linear expansion c is decreased and is used. This method includes a technique for adding a filler to a resin.

(3) A method for decreasing the modulus of elasticity (Young's modulus of elasticity) E. This method includes a technique for obtaining a "sea and island" structure of resins.

(4) A method for decreasing the shrinkage factor $\epsilon$ during the curing of a resin. This method includes a technique for performing a reaction so as to cause uniform progress of resin curing.

An increase in the flexibility and a decrease in the crosslinking density of an encapsulant cause degradation of the heat resistance of the resin and an increase in the coefficient of linear expansion $\alpha$. When a filler is added to a resin, the transparency of the resin is degraded, and its modulus of elasticity E is increased. In addition, when a "sea and island" structure of the resins is obtained, its heat resistance is decreased. Furthermore, to cause a uniform curing reaction of the resin is to greatly degrade workability.

SUMMARY OF THE INVENTION

The first object of the present invention is to provide a light-emitting diode device having a long service life, wherein quality degradation caused by the internal stress of an encapsulant is minimized.

The second object of the present invention is to provide a low-stress encapsulating epoxy resin composition suitable as an encapsulant of a semiconductor, especially a light-emitting diode.

The first object of the present invention can be achieved by a light-emitting diode device comprising:

a light-emitting diode chip;

lead-frames respectively connected to an anode and a cathode of the light-emitting diode chip;

an encapsulant for encapsulating the light-emitting diode chip and the lead-frames; and a buffer layer formed between the encapsulant, on the one hand, and the light-emitting diode chip and the lead-frames, on the other, for reducing the stress acting from the encapsulant on the light-emitting diode chip and the lead-frames.

In this LED device, the stress generated by the encapsulant can be reduced by a buffer layer formed between the encapsulant, on the one hand, and the LED chip constituting this device and the lead-frames connected to the LED chip, on the other. For this reason, the LED chip and the lead-frames in the LED device can be almost free from the influence due to the stress generated by the encapsulant. Even if such an influence due to the stress occurs, it is very small.

The second object of the present invention can be achieved by an encapsulating epoxy resin composition comprising:

100 parts by weight of an epoxy resin;

70 to 140 parts by weight of a curing agent including an acid anhydride;

0.5 to 4.0 parts by weight of a curing accelerator containing onium salts or diazabicycloalkene salts; and 0.1 to 5.0 parts by weight of a sulfur-containing phosphorus compound.

This resin composition results in a transparent resin and allows formation of a buffer layer at the interfaces of, e.g., the semiconductor chip and the lead-frames which are encapsulated with the resin. The buffer layer reduces the stress generated in the encapsulant. In a semiconductor device having this resin composition as an encapsulant, the semiconductor chip, the lead-frames and the like which are encapsulated with this encapsulant are free from the stress generated by the encapsulant. This resin composition is particularly suitable as an encapsulant for the LED device.

BRIEF DESCRIPTION OF THE DRAWINGS

FIG. 5 is a sectional view of a solid-state pickup device according to an embodiment of the present invention; and FIG. 6 is a sectional view of a conventional solid-state image pickup device.

DETAILED DESCRIPTION OF THE PREFERRED EMBODIMENTS

Figure 1:
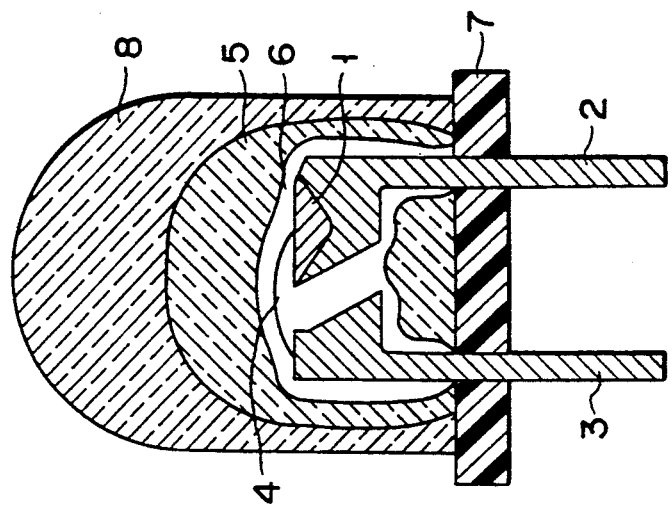
FIG. 1 is a sectional view showing an LED device according to an embodiment of the present invention.

An LED device according to the present invention will be described with reference to the accompanying drawings. FIG. 1 is a sectional view of an LED device according to the present invention. An LED chip 1 is arranged at one end of a lead-frame 2, the LED chip 1 and the lead-frame 2 are connected at the cathode of the LED chip 1, and the anode of the LED chip 1 is connected to a lead-frame 3 through a wire 4. With this arrangement, the lead-frame 2 serves as the cathode of the LED device, and the lead-frame 3 serves as the anode of the LED device. Portions of the lead-frames 2 and 3 near the connections between the LED chip 1, LED chip 1 and the wire 4 are encapsulated with an encapsulant 5. The other end of each of the lead-frames 2 and 3 is guided outside the encapsulant 5 through a support 7 arranged in the lower portion of the LED device. A buffer layer 6 is formed between the encapsulant 5, on the one hand, and the LED chip 1, the lead-frames 2 and 3, and the wire 4, on the other. The buffer layer 6 reduces the stress generated by the encapsulant 5. Since the stress generated by the encapsulant 5 can be reduced by the buffer layer 6, the LED chip 1, the lead-frames 2 and 3, and the wire 4 are not subjected to excessive force. Therefore, even if an IR or yellow LED chip which is particularly, susceptible to the stress of the encapsulant is used, high quality can be maintained for a long period of time.

The buffer layer 6 is usually a space formed between the encapsulant 5, on the one hand, and the LED chip 1, the lead frames 2 and 3, and the wire 4, on the other. Another material, such as one component of the encapsulant, and which does not interfere with the decrease in stress generated by the resin, can be present in this space. The buffer layer 6 may be a layer of a material for reducing or minimizing the stress generated by the resin.

An encapsulating epoxy resin composition according to the present invention can thus be suitably used as an encapsulant for the above-mentioned LED device.

The encapsulating epoxy resin composition of the present invention comprises:
100 parts by weight of an epoxy resin;
70 to 140 parts by weight of a curing agent containing an acid anhydride;
0.5 to 4.0 parts by weight of a curing accelerator containing onium salts or diazabicycloalkene salts; and
0.1 to 5.0 parts by weight of a sulfur-containing phosphorus compound.

The encapsulating epoxy resin composition of the present invention has an internal release effect. That is, a resin made from the resin composition is released at the resin interface with the semiconductor chip, lead-frames, and the like which are encapsulated by the resin to form a space. This space can reduce the stress generated by the resin and protects the chip and the lead-frames which are encapsulated by the resin. In other words, the space serves as a buffer layer.

Examples of the epoxy resin used in the epoxy resin composition according to the present invention are a bisphenol-type epoxy resin, a cycloaliphatic epoxy resin, a novolak-type epoxy resin, and a saturated or unsaturated epoxy resin. These epoxy resins may be used singly or in a combination of two or more resins. In order to reduce the resin stress, the epoxy resins may be treated by using a known technique for reducing this stress. For example, a flexibilizer may be added to the epoxy resins, or the epoxy resins may be reacted with a flexibilizer called a reactive liquid plastic (RLP) to obtain a modified epoxy resin.

The curing agent used in the encapsulating epoxy resin composition includes an acid anhydride. Examples of the acid anhydride are phthalic anhydride, hexahydrophthalic anhydride, tetrahydrophthalic anhydride, methylhexahydrophthalic anhydride, methyltetrahydrophthalic anhydride, maleic anhydride, succinic anhydride, dodecylsuccinic anhydride, dichlorosuccinic anhydride, methylnadic anhydride, pyromellitic anhydride, chlorendic anhydride, and benzophenonetetracarboxylic anhydride. The content of the curing agent falls within the range of 70 parts by weight to 140 parts by weight with respect to 100 parts by weight of the epoxy resin. If the content of the curing agent is less than 70 parts by weight, coloring of the resin tends to occur and the glass transition temperature (Tg) tends to decrease. However, if the content exceeds 140 parts by weight, a noncured portion is often left upon curing of the resin composition. A resin having the noncured portion indicates degradation in heat resistance and water-resistance of the resin composition.

A curing accelerator including onium salts or diazabicycloalkene salts is used in the encapsulating epoxy resin composition in addition to the above curing agent.

An onium salt used as a curing accelerator in the encapsulating epoxy resin composition can be represented by the following formula:

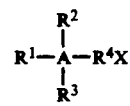

wherein each of $R^1$, $R^2$, $R^3$, and $R^4$ independently represents a benzyl group, an alkyl group, or a phenyl group, X represents a halogen group, or carboxyl group

in which Y represents alkyl group, and A represents nitrogen or phosphorus.

Examples of the onium salts are benzyltrimethylammonium iodide, benzyltriethylammonium chloride, tetrabutylphosphonium chloride, tetramethylphosphonium bromide, triphenylmethylsulfonium iodide, tetrabutylphosphonium acetate, methyltrioctylphosphonium dimethylphosphate, tetraethylammonium chloride, and tetramethylammonium bromide.

Diazabicycloalkene salts used as curing accelerators in the encapsulating epoxy resin composition according to the present invention are, for example, a caproate, a sulfonate, an acetate, and a phosphate of 1,8-diazabicyclo(4,5,0)undecene.

The content of the onium salts or diazabicycloalkene salts used as the curing accelerator in the encapsulating epoxy resin composition preferably falls within the range of 0.5 to 4.0 parts by weight with respect to 100 parts by weight of epoxy resin. If the content of the curing accelerator is less than 0.5 parts by weight, a satisfactory effect cannot be obtained. However, when the content of the curing accelerator exceeds 4.0 parts by weight, foaming and coloring of a resin made from the resin composition may occur.

The encapsulating epoxy resin composition can have a fast curing property by increasing the curing temperature or the amount of curing accelerator. In addition, by adjusting the content of the curing agent, the crosslinking density of the cured resin composition can be changed. In either case, a low-stress resin composition can be obtained by a combination of the curing agent and the curing accelerator. This obtained resin composition is free from coloring and maintains transparency, when it is cured.

A sulfur-containing phosphorus compound used in the encapsulating epoxy resin composition according to the present invention can be represented by the following formula:

$$(R_l^5 R_m^6 (R^7 S)_n)P$$

wherein each of $R^5$, $R^6$, and $R^7$ independently represents an alkyl group, an alkoxyl group, a phenyl group, a phenoxy group, or a benzyl group, S represents sulfur, P represents phosphorus, each of l, m, and n independently represents an integer of 0 to 3, provided that $l+m+n=3$.

Examples of the sulfur-containing phosphorus compound are trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, trisphenoxythiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite. These compounds can be used singly or in a combination of at least two compounds.

The sulfur-containing phosphorus compound has an antioxidation effect and suppresses an abrupt curing reaction of the resin composition. Therefore, when the sulfur-containing phosphorus compound is added in the encapsulating epoxy resin composition, resin strain can be minimized during curing.

In the encapsulating epoxy resin composition, the content of the sulfur-containing phosphorus compound preferably falls within the range of 0.1 to 5.0 parts by weight with respect to 100 parts by weight of the epoxy resin. If the content of the sulfur-containing phosphorus compound is less than 0.1 parts by weight, the above effect cannot be sufficiently obtained. However, if the content exceeds 5.0 parts by weight, the heat resistance of the resin composition and the curing rate of the resin composition tend to decrease.

The encapsulating epoxy resin composition of the present invention can contain a silane coupling agent as needed. The silane coupling agent used in this resin composition can be represented by one of the following formulas:

$$HS-R-Si(R_l^5 R_m^6 R_n^7)$$

and $$(HS-R)_3 SiR^5$$

wherein R represents an alkylene group, an alkyleneoxy group, a phenylene group, a phenyleneoxy group, a benzylidene group, or a benzylene group, each of $R^5$, $R^6$, and $R^7$ independently represents an alkyl group, an alkoxyl group, a phenyl group, a phenoxy group, or a benzyl group, each of l, m, and n independently represents an integer of 0 to 3, provided that $l+m+n=3$.

The silane coupling agent can suppress an abrupt curing reaction in the resin composition. When the silane coupling agent is added to the composition, its internal release effect can be enhanced.

Examples of the silane coupling agent are mercaptomethyltriphenylsilane, β-mercaptoethyltriphenylsilane, γ-mercaptopropyltriphenylsilane, γ-mercaptopropyldiphenylmethylsilane, γ-mercaptopropylphenyldimethylsilane, δ-mercaptobutylphenyldimethylsilane, δ-mercaptobutyltriphenylsilane, tris(β-mercaptoethyl)phenylsilane, tris(γ-mercaptopropyl)phenylsilane, tris(γ-mercaptopropyl)methylsilane, tris(γ-mercaptopropyl)ethylsilane, and tris(γ-mercaptopropyl)benzylsilane. These compounds can be used singly or in a combination of at least two compounds.

In the encapsulating epoxy resin composition according to the present invention, the content of the silane coupling agent preferably falls within the range of 0.5 to 5.0 parts by weight with respect to 100 parts by weight of epoxy resin. If the content of the silane coupling agent is less than 0.5 parts by weight, the above effect cannot be sufficiently obtained. However, if the content exceeds 5.0 parts by weight, the resin composition cannot be sufficiently cured, and the heat resistance is decreased.

The encapsulating epoxy resin composition of the present invention can also contain a colorant, a flexibilizer, a modifier, an antioxidant, and the like, as needed.

The encapsulating epoxy resin composition of the present invention can be cured at a temperature of 180° C or less within about 60 to 120 minutes. The resultant cured product is almost free from foaming and coloring.

Figure 2:
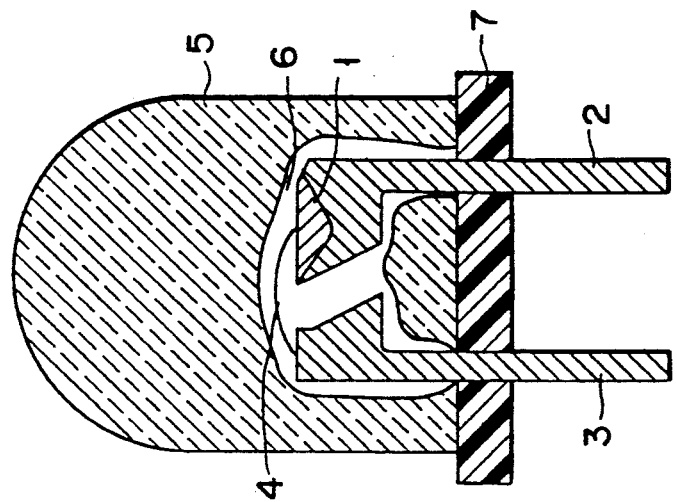
FIG. 2 is a sectional view of an LED device according to another embodiment of the present invention.

The encapsulating epoxy resin composition according to the present invention can be suitably used as an encapsulant for an LED device, and particularly, for an IR or yellow LED, both of which are very sensitive to the stress generated by the encapsulant. This resin composition is generally applied to the whole encapsulant 5 shown in FIG. 1. In addition, as shown in FIG. 2, the encapsulating resin composition of the present invention may be used as a portion 5 of the total encapsulant for surrounding the LED chip 1, the lead-frames 2, and 3, and the wire 4, and the encapsulant 5 may be further covered with a conventional encapsulant 8.

The present invention will be described in detail by way of examples. In the following examples and comparative examples, "parts" represents "parts by weight".

EXAMPLE 1

100 parts of 4-methylhexahydrophthalic anhydride (MHHPA available from Shin-Nihon Rika) as an acid anhydride curing agent, one part of tetrabutylammonium chloride (available from Koei Kagaku and to be referred to as TBACl hereinafter) as a curing accelerator, one part of trislaurylthiophosphite (jps-312 available from Johoku Kagaku and referred to as TRSP hereinafter) as a sulfur-containing phosphorus compound, 2 parts of an antioxidant, and 0.5 parts of other additives, such as an anti-foaming agent and a colorant, were mixed to obtain an acid anhydride curing agent composition. 120 parts of this acid anhydride curing agent composition were mixed with 100 parts of an epoxy resin obtained by mixing a bisphenol A type epoxy resin (EP-828 available from Yuka Shell) and an alicyclic epoxy resin (ERL-4221 available from Union Carbide) at a mixing ratio of 50:50 (wt %), thereby preparing an encapsulating epoxy resin.

EXAMPLE 2

An encapsulating epoxy resin composition was prepared following the same procedures as in Example 1 except that one part of γ-mercaptopropyltriphenylsilane (A-189 available from Nihon Yunicar and to be referred to as MPTPSi hereinafter) as a silane coupling agent was added in the anhydride curing agent composition with respect to 100 parts of MHHPA.

COMPARATIVE EXAMPLE 1

An epoxy resin composition was prepared following the same procedures as in Example 1 except that one part of MPTPSi was added in the composition with respect to 100 parts of MHHPA and TRSP was not added in the composition.

COMPARATIVE EXAMPLE 2

An epoxy resin was prepared following the same procedures as in Example 1 except that TRSP was not added in the composition.

EXAMPLE 3

10 parts of a reactive liquid polybutadiene (C-1000 available from Nihon Soda) having terminal carboxyl groups was mixed with 100 parts of an epoxy resin as in Example 1 and reacted therewith at 80° C. for 6 hours to prepare a modified epoxy resin. 100 parts of MHHPA, one part of TBACl, one part of TRSP, 2 parts of an antioxidant, and 0.5 parts of other additives such as an anti-foaming agent and a colorant were mixed to prepare an acid anhydride curing agent composition. 100 parts of the modified epoxy resin was mixed with 120 parts of the acid anhydride curing agent composition to prepare an encapsulating epoxy resin composition.

EXAMPLE 4

One part of MPTPSi was added to an acid anhydride curing agent composition prepared in Example 3 with respect to 100 parts of MHHPA. 120 parts of the resultant acid anhydride curing agent composition was mixed with 110 parts of an epoxy resin prepared in Example 3 to prepare an epoxy resin composition.

COMPARATIVE EXAMPLE 3

An acid anhydride curing agent composition was prepared such that one part of MPTPSi was added to the acid anhydride curing agent composition prepared in Example 3 with respect to 100 parts of MHHPA and TRSP was not added thereto. An epoxy resin composition was prepared following the same procedures as in Example 3 except that the resultant acid anhydride curing agent composition was used.

COMPARATIVE EXAMPLE 4

An acid anhydride curing agent composition was prepared as in Example 3 without adding TRSP. An epoxy resin composition was prepared following the same procedures as in Example 3 except that the resultant acid anhydride curing agent composition was used.

COMPARATIVE EXAMPLES 5-8

One part of a wax selected from the group consisting of two carnauba waxes (carnauba wax Nos. 1 and 2 available from Noda Wax) and paraffin waxes (paraffin wax Nos. 1 and 2 available from Nippon Seirou) having different molecular weights was added to the epoxy resin composition prepared in Comparative Example 3 with respect to 100 parts of MHHPA in each comparative example. These four waxes are typical conventional internal release type waxes. The resultant epoxy resin samples were used to confirm reduction in stress by the internal release effect of the encapsulating epoxy resin composition of the present invention.

Test pieces for fundamental stress data measurements were prepared using the epoxy resin compositions prepared in Examples 1 to 4 and Comparative Examples 1 to 8. Each test piece was heated and cured at 125° for 2 hours and then at 160° C. for 2 hours. The stress measurement of each test piece was performed by a copper ring method. Measuring conditions were a maximum temperature of 170° C. and a temperature rise rate of 1° C./min. The results are summarized in Table 1.

TABLE 1

| | Additives | Content with Respect to 100 Parts by Weight of MHHPA (parts) | Stress strain (%) |
|---|---|---|---|
| Example 1 | TRSP | 1.0 | 124 |
| Example 2 | TRSP/MPTPSi | 1.0/1.0 | 91 |
| Comparative Example 1 | MPRPSi | 1.0 | 128 |
| Comparative Example 2 | — | — | 134 |
| Example 3 | TRSP | 1.0 | 102 |
| Example 4 | TRSP/MPTPSi | 1.0/1.0 | 79 |
| Comparative Example 3 | MPTPSi | 1.0 | 105 |
| Comparative Example 4 | — | — | 109 |
| Comparative Example 5 | carnauba wax No. 1 | 1.0 | 109 |
| Comparative Example 6 | carnauba wax No. 2 | 1.0 | 110 |
| Comparative Example 7 | paraffin wax No. 1 | 1.0 | 112 |
| Comparative Example 8 | paraffin wax No. 2 | 1.0 | 112 |

TRSP: trislaurylthiophosphite (jps-312)
MPTPSi: γ-mercaptopropyltriphenylsilane (A-189)

EXAMPLE 5

Two LED devices were prepared using the resin composition prepared in Example 4 (this composition will be referred to as composition A hereinafter) and a resin composition prepared in Comparative Example 2 (this composition will be referred to as composition B hereinafter) as encapsulants. Each LED device has the same structure as the LED device whose section is shown in FIG. 1. An IR LED chip very sensitive to the stress generated by the encapsulant was used in each LED device.

Figure 3:
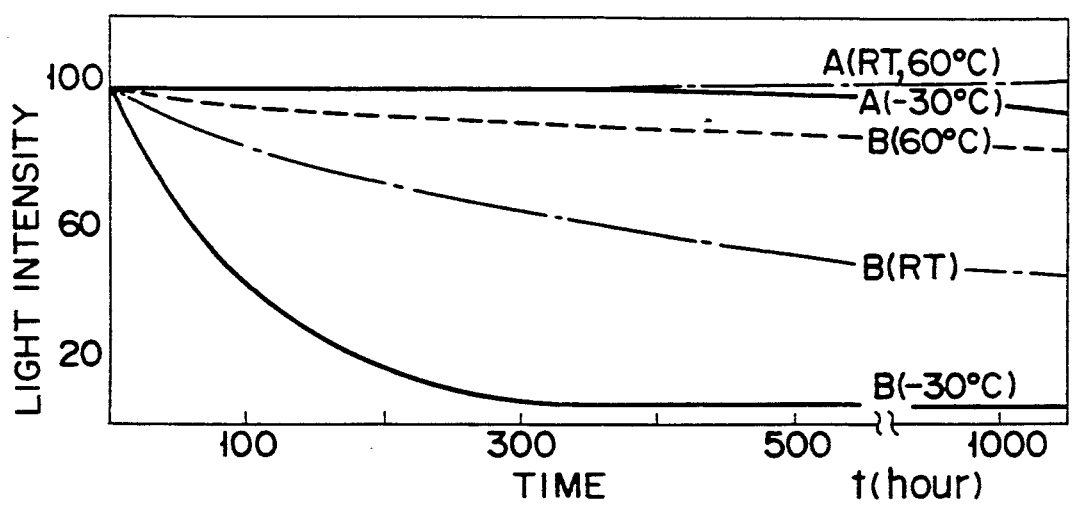
FIG. 3 is a graph showing luminance lifetimes of LED devices using an encapsulating epoxy resin according to the present invention and a conventional encapsulating epoxy resin.

An emission life time test of the LED devices was performed, the results of which are shown in FIG. 3. Measurements were performed at low temperature (−30° C.) at which strain tended to occur due to the resin stress, room temperature (RT), and a high temperature (60° C.). Time is plotted along the abscissa of the graph in FIG. 3, and the light intensity (percentage) of each LED device with respect to the initial light intensity of each LED device as 100 is plotted along the ordinate. Referring to FIG. 3, the solid curves represent measurement values at −30° C., the broken curve represents measurement values at RT, and the alternate long and one short dashed curve represents measurement values at 60° C.

As is apparent from FIG. 3, the emission intensity of the LED device in which an LED chip and the like are encapsulated with composition B is greatly decreased since the LED chip and the like receive stress from the encapsulant. On the other hand, a sufficient light intensity is maintained for a long period of time in the LED device obtained by using composition A, i.e., the device having a buffer layer between the LED chip, etc. and the encapsulant.

EXAMPLE 6

Figure 4:
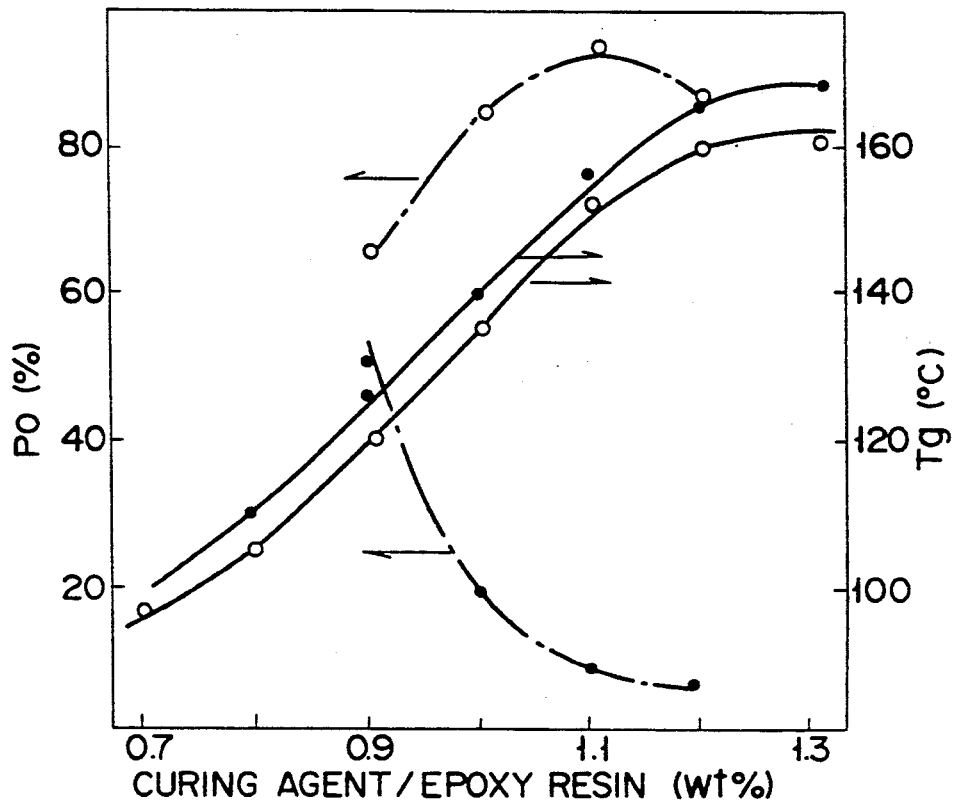
FIG. 4 is a graph showing glass transition temperatures (Tg) and luminance lifetimes (Po) of the encapsulating epoxy resin according to the present invention and a conventional encapsulating epoxy resin.

Several resin compositions were prepared such that mixing ratios of the epoxy resins to the acid anhydride curing agent compositions were changed in the resin compositions prepared in Example 4 and Comparative Example 2. These ratios were set to fall within the mixing ratio of the curing agent composition to the epoxy resin in the encapsulating epoxy resin composition of the present invention. Glass transition temperatures (Tg) of these resin compositions were measured as a criterion for heat resistance. Measurement results are shown in the graph of FIG. 4. Referring to FIG. 4, the white dot represents the result of a resin composition prepared based on the composition of Example 4, whereas the black dot represents the result of a resin composition prepared based on the composition of Comparative Example 2. The ratio of the curing agent to the epoxy resin is plotted in wt % along the abscissa, whereas the glass transition temperature is plotted along the right ordinate.

LED devices were prepared following the same procedures as in Example 5 except that the above resin compositions were used as encapsulants. Luminance life (Po) test of these LED devices was conducted as a criterion for determining reduction in stress generated by the resin. This test was conducted by supplying a current of 50 mA to each LED device at −30° C. for 120 hours. The luminance level after the test with respect to the initial luminance of each LED device is plotted in percentage. Test results are also summarized in FIG. 4.

New properties were found which can be typically obtained when the mixing ratio of the curing agent composition to the epoxy resin falls within the range of 1.0 to 1.2, and are opposite to those of the conventional encapsulant. As is apparent from FIG. 4, the luminance level of the conventional resin composition (i.e., the resin composition prepared based on the composition of Comparative Example 2) is greatly lowered when the Tg is increased because it is assumed that the resin stress acting on the LED chip and the like is increased with an increase in Tg. However, the luminance level of the resin composition prepared based on the composition of Example 4 does not decrease even if the Tg is increased. Therefore, the resin composition of the present invention can achieve a long service life without decreasing the Tg.

EXAMPLE 7

100 parts of MHHPA as an acid anhydride curing agent, one part of triphenylbenzylphosphonium chloride (available from Hokko Chemical Industry Co., Ltd. and to be referred to as TPPZC hereinafter) as a curing accelerator, one part of trisstearylthiophosphite (jps-318 available from Johoku Kagaku and to be referred to as TSSP hereinafter) as a sulfur-containing phosphorus compound, 2 parts of an antioxidant, and 0.5 parts of other additives, such as an anti-foaming agent and a colorant, were mixed to prepare an acid anhydride curing agent composition. 120 parts of this acid anhydride curing agent composition were mixed with 100 parts of an epoxy resin obtained by mixing a bisphenol A type epoxy resin (EP-828 available from Yuka Shell) and an alicyclic epoxy resin (ERL-4221 available from Union Carbide) at a mixing ratio of 50:50 (wt %) to prepare an encapsulating epoxy resin composition.

EXAMPLE 8

An encapsulating epoxy resin composition was prepared following the same procedures as in Example 7 except that one part of MPTPSi was further added in the acid anhydride curing agent composition prepared in Example 7 with respect to 100 parts of MHHPA.

COMPARATIVE EXAMPLE 9

An epoxy resin composition was prepared following the same procedures as in Example 7 except that TSSP was not added in the acid anhydride curing agent composition prepared in Example 7, and one part of MPTPSi was added thereto with respect to 100 parts of MHHPA.

COMPARATIVE EXAMPLE 10

An epoxy resin composition was prepared following the same procedures as in Example 7 except that TSSP was not added in the acid anhydride curing agent composition prepared in Example 7.

EXAMPLE 9

10 parts of a reactive liquid polybutadiene (C-1000 available from Nihon Soda), having terminal carboxyl groups, was mixed with 100 parts of an epoxy resin prepared in Example 7 and reacted therewith at 80° C. for 6 hours to prepare a modified epoxy resin. 100 parts of MHHPA, one part of TPPZC as a curing accelerator, one part of trisbutylthiophosphite (jps-x available from Johoku Kagaku and to be referred to as TBSP hereinafter) as a sulfur-containing phosphorus compound, 2 parts of an antioxidant, and 0.5 parts of other additives such as an anti-foaming agent and a colorant were mixed to prepare an acid anhydride curing agent composition. 110 parts of the modified epoxy resin were mixed with 120 parts of the acid anhydride curing agent composition to prepare an encapsulating epoxy resin composition.

EXAMPLE 10

One part of MPTPSi was added to the acid anhydride curing agent composition prepared in Example 7 with respect to 100 parts of MHHPA. 120 parts of this acid anhydride curing agent composition were mixed with 110 parts by weight of the modified epoxy resin prepared in Example 9 to prepare an encapsulating epoxy resin.

COMPARATIVE EXAMPLE 11

An epoxy resin composition was prepared following the same procedures as in Example 9 except that TSSP was not added in the acid anhydride curing agent composition and one part of MPTPSi was added thereto with respect to 100 parts of MHHPA.

COMPARATIVE EXAMPLE 12

An epoxy resin was prepared following the same procedures as in Example 9 except that TSSP was not added in an acid anhydride curing agent composition.

Test pieces for fundamental stress data measurements were prepared using the epoxy resin compositions prepared in Examples 7 to 10 and Comparative Examples 9 to 12. Each test piece was heated and cured at 125° for 2 hours, then at 160° C. for 2 hours, and the stress measurement of each test piece was performed by a copper ring method. Measuring conditions were a maximum temperature of 170° C. and a temperature rise rate of 1° C./min. The results are summarized in Table 2.

TABLE 2

| | Additives | Content with Respect to 100 Parts by Weight of MHHPA (parts) | Stress strain (%) |
|---|---|---|---|
| Example 7 | TSSP | 1.0 | 124 |
| Example 8 | MPTPSi/TSSP | 1.0/1.0 | 98 |
| Comparative Example 9 | MPTPSi | 1.0 | 128 |
| Comparative Example 10 | — | — | 134 |
| Example 9 | TBSP | 1.0 | 112 |
| Example 10 | MPTPSO/TBSP | 1.0/1.0 | 79 |
| Comparative Example 11 | MPTPSi | 1.0 | 118 |
| Comparative Example 12 | — | — | 127 |

TSSP: tristearylthiophosphite (jps-318)
TBSP: trisbutylthiophosphite (jps-x)
MPTRSi: γ-mercaptopropyltriphenylsilane (A-189)

EXAMPLE 11

A solid-state image pickup device shown in FIG. 5 was manufactured by using the transparent epoxy resin prepared in Example 1 as encapsulant. As shown in FIG. 5, a color CCD element 2 placed on a ceramic substrate 1 is connected to lead-frames 3 through bonding wires 4. A transparent glass plate 7 is arranged on the ceramic substrate 1 through a Kovar ring and a Kovar frame 6 to seal the color CCD element 2. In this device, a space between the ceramic substrate 1 and the transparent glass plate 7 is further filled with a resin 8. This resin 8 is obtained by curing the epoxy resin composition prepared in Example 1 under given conditions. A space is kept formed between a ceramic substrate 1 and a transparent glass plate 7 in a conventional image pickup device, as shown in FIG. 6.

In the conventional device shown in FIG. 6, since air is present between the ceramic substrate 1 and the transparent glass plate 7, particles floating in the air cross over the upper surface of a CCD element to often mix noise in an image signal. To the contrary, in the device of the present invention, since the space is filled with the resin 8, the conventional problem is not posed.

Since the resin filled in the space of the device of Example 11 has a low stress, this resin does not adversely affect the sealed CCD element. In addition, the device of Example 11 had an improved moisture-resistant property. That is, it was found that the service life of the CCD element could be greatly prolonged by using the epoxy resin composition of the present invention.

As described above, the encapsulating epoxy resin composition of the present invention can, to an insignificant extent, reduce strain caused by the stress generated by the resin. The stress generated by the resin can be sufficiently reduced in the encapsulating epoxy resin composition by adding a small amount of additives, thus preventing the degradation of other properties such as heat resistance. Therefore, the encapsulating epoxy resin composition of the present invention can be suitably used as an encapsulant for LED devices. In addition, applications of the encapsulating epoxy resin composition of the present invention are not limited to LED devices, but can be extended to CCDs, LSIs, and the like.

What is claimed is:

1. An encapsulating epoxy resin composition consisting essentially of:
   100 parts by weight of an epoxy resin;
   70 to 140 parts by weight of a curing agent including an acid anhydride;
   0.5 to 4.0 parts by weight of a curing accelerator including an onium or diazabicycloalkene salt;
   0.5 to 5.0 parts by weight of a phosphorus triphosphite; and
   0.5 to 5.0 parts by weight of a silane coupling agent represented by one of the following formulas:

$$HS-R-Si\ (R_l{}^5R_m{}^6R_n{}^7)$$

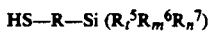

or $$(HS-R)_3SiR^5$$

wherein R represents an alkylene group, an alkyleneoxy group, a phenylene group, a phenyleneoxy group, a benzylidene group, or a benzylene group; each of $R^5$, $R^6$, and $R^7$ independently represents an alkyl group, an alkoxy group, a phenyl group, a phenoxy group or a benzyl group; and each of l, m, and n independently represents an integer of 0 to 3, provided that $1+m+n=3$.

2. A composition according to claim 1, wherein the silane coupling agent is a silane coupling agent containing a mercapto group.

3. A composition according to claim 1, wherein the thiophosphite is represented by the following formula:

$$R_l{}^5R_m{}^6(R^7S)_nP$$

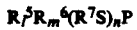

wherein each of $R^5$, $R^6$, and $R^7$ independently represents an alkyl group, an alkoxy group, a phenyl group, a phenoxy group, or a benzyl group, S represents sulfur, P represents phosphorus, each of l, m, and n independently represents an integer of 0 to 3, provided that $1+m+n=3$.

4. A composition according to claim 1, wherein the thiophosphite is a compound selected from the group consisting of trismethylthiophosphite, trisethylthiophosphite, trispropylthiophosphite, trispentylthiophosphite, tris-hexylthiophosphite, trisheptylthiophosphite, trisoctyl-thiophosphite, trisnonylthiophosphite, trislaurylthio-phosphite, trisphenylthiophosphite, trisbenzylthio-phosphite, trisphenoxythiophosphite, bispropiothio-methylphosphite, bispropiothiononylphosphite, bisnonyl-thiomethylphosphite, bisnonylthiobutylphosphite, methylethylthiobutylphosphite, methylethylthiopropio-phosphite, methylnonylthiobutylphosphite, methylnonyl-thiolaurylphosphite, and pentylnonylthiolauryl-phosphite.

5. A composition according to claim 1, wherein the epoxy resin is at least one resin selected from the group consisting of a bisphenol epoxy resin, an alicyclic epoxy resin, a novolak epoxy resin, and saturated and unsaturated aliphatic epoxy resins, the curing agent is an anhydride selected from the group consisting of phthalic anhydride, hexahydrophthalic anhydride, tetrahydrophthalic anhydride, methylhexahydrophthalic anhydride, methyltetrahydrophthalic anhydride, maleic anhydride, succinic anhydride, dodecylsuccinic anhydride, dichlorosuccinic anhydride, methylnadic anhydride, pyromellitic anhydride, chlorendic anhydride, and benzophenonetetracarboxylic anhydride, the curing accelerator is a compound selected from the group consisting of benzyltrimethylammonium iodide, benzyltriethylammonium chloride, tetrabutylphosphonium chloride, tetramethylphosphonium bromide, triphenylmethyl-sulfonium iodide, tetrabutylphosphonium acetate, methyltrioctylphosphonium dimethylphosphate, tetraethylammonium chloride, tetramethylammonium bromide, and a caproate, a sulfonate, an acetate, and a phosphate of 1,8-diazabicyclo(4,5,0)undecene, and the silane coupling agent is a compound selected from the group consisting of mercaptomethyltriphenyl-silane, $\beta$-mercaptoethyltriphenyl-silane, $\gamma$-mercaptopropyltriphenylsilane, $\gamma$-mercaptopropyldiphenylmethylsilane, $\gamma$-mercaptopropylphenyldimethylsilane, $\delta$-mercaptobutylphenyldimethylsilane, $\delta$-mercaptobutyltriphenylsilane, tris($\beta$-mercaptoethyl) phenylsilane, tris($\gamma$-mercapto-propyl)-phenylsilane, tris($\gamma$-mercaptopropyl)methyl-silane, tris($\gamma$-mercaptopropyl)ethylsilane mercaptopropyl)benzylsilane.

* * * * *